United States Patent
Han et al.

(10) Patent No.: US 11,931,775 B2
(45) Date of Patent: Mar. 19, 2024

(54) LAMINATE, DISPLAY INCLUDING THE SAME, AND ARTICLE INCLUDING THE DISPLAY

(71) Applicant: Samsung Electronics Co., Ltd., Suwon-si (KR)

(72) Inventors: Jungim Han, Yongin-si (KR); Hyeyoung Kong, Uijeongbu-si (KR); Byungha Park, Suwon-si (KR); Fedosya Kalinina, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 483 days.

(21) Appl. No.: 17/323,921

(22) Filed: May 18, 2021

(65) Prior Publication Data

US 2022/0184658 A1 Jun. 16, 2022

(30) Foreign Application Priority Data

Dec. 11, 2020 (KR) .................. 10-2020-0173503

(51) Int. Cl.
| | |
|---|---|
| *B05D 7/00* | (2006.01) |
| *B05D 1/00* | (2006.01) |
| *B05D 3/00* | (2006.01) |
| *C08G 65/00* | (2006.01) |
| *C08G 65/336* | (2006.01) |
| *C09D 171/00* | (2006.01) |
| *C23C 14/10* | (2006.01) |
| *C23C 14/12* | (2006.01) |
| *C23C 14/34* | (2006.01) |
| *C23C 14/58* | (2006.01) |
| *G02F 1/1333* | (2006.01) |

(52) U.S. Cl.
CPC .............. *B05D 7/52* (2013.01); *B05D 1/60* (2013.01); *B05D 3/007* (2013.01); *C09D 171/00* (2013.01); *C23C 14/10* (2013.01); *C23C 14/34* (2013.01); *C23C 14/5846* (2013.01); *C08G 65/007* (2013.01); *C08G 65/336* (2013.01); *C08G 2650/02* (2013.01); *C08G 2650/48* (2013.01); *C23C 14/12* (2013.01); *G02F 1/13338* (2013.01)

(58) Field of Classification Search
None
See application file for complete search history.

(56) References Cited

U.S. PATENT DOCUMENTS

| | | | |
|---|---|---|---|
| 7,794,843 B2 | 9/2010 | Yamane et al. | |
| 10,329,192 B2 | 6/2019 | Kim et al. | |
| 10,675,658 B2 | 6/2020 | Audenaert | |
| 11,041,092 B2 | 6/2021 | Han et al. | |
| 2021/0214495 A1 | 7/2021 | Chen et al. | |
| 2021/0261813 A1 | 8/2021 | Han et al. | |

FOREIGN PATENT DOCUMENTS

| | | |
|---|---|---|
| JP | 5064012 B2 | 10/2012 |
| JP | 6601492 B2 | 11/2019 |
| KR | 20120139919 A | 12/2012 |
| KR | 101524271 B1 | 5/2015 |
| KR | 101909804 B1 | 10/2018 |
| KR | 1020200021200 A | 2/2020 |
| KR | 1020200096663 A | 8/2020 |
| KR | 1020210106801 A | 8/2021 |
| WO | 2011043973 A1 | 4/2011 |
| WO | WO-2016006584 A1 * | 1/2016 ................ C07F 7/18 |

OTHER PUBLICATIONS

WO2016006584 English Machine translation, prepared Oct. 30, 2023. (Year: 2023).*
English Abstract of KR 10-2012-0139919.
English Abstract of WO 2016-006584.
English Abstract of WO 2016-190047.

* cited by examiner

*Primary Examiner* — Christopher M Rodd
(74) *Attorney, Agent, or Firm* — CANTOR COLBURN LLP

(57) ABSTRACT

A laminate, a display device including the laminate, and an article including the display, the laminate including a substrate, a protective layer, and an intermediate layer provided between the substrate and the protective layer, wherein the protective layer includes a fluorine-containing (poly)ether amide silane compound represented by Formula 1 and having a molecular weight greater than 2,000 Da, and the intermediate layer includes at least one Si—O bond and having a density greater than about 2.0 g/cm³ and less than about 2.5 g/cm³, $$Rf-(L1)_{p1}-Q1-(L2)_{p2}-Si(R_1)(R_2)(R_3) \quad \text{Formula 1}$$

wherein, in Formula 1, Rf, L1, p1, Q1, L2, p2, $R_1$ to $R_3$ are the same as described in the specification.

20 Claims, 5 Drawing Sheets

FIG. 5

| COMPARATIVE EXAMPLE 8 (1.7K) | COMPARATIVE EXAMPLE 9 (4K) | COMPARATIVE EXAMPLE 10 (7K) |
|---|---|---|
| COMPARATIVE EXAMPLE 11 (1.7K) | COMPARATIVE EXAMPLE 12 (4K) | COMPARATIVE EXAMPLE 13 (7K) |
| COMPARATIVE EXAMPLE 14 (1.7K) | COMPARATIVE EXAMPLE 15 (4K) | COMPARATIVE EXAMPLE 16 (7K) |

LAMINATE, DISPLAY INCLUDING THE SAME, AND ARTICLE INCLUDING THE DISPLAY

CROSS-REFERENCE TO RELATED APPLICATION

This application is based on and claims priority to Korean Patent Application No. 10-2020-0173503, filed on Dec. 11, 2020, in the Korean Intellectual Property Office, and all the benefits accruing therefrom under 35 U.S.C. § 119, the entire content of which is incorporated by reference herein.

BACKGROUND

1. Field

The present disclosure relates to a laminate having a novel structure, a display including the laminate, and an article including the display.

2. Description of the Related Art

A portable electronic device such as a smart phone or a tablet PC may include functional layers having various functions.

Recently, use of a touch screen panel for recognizing a contact position through a finger or a tool has become common.

To improve the surface slipping property and the sense of touch (e.g., the feel) of a touch screen panel, a functional layer is applied to the surface of a display panel. However, salts generated from the sweat of fingers may diffuse into the functional layer and deteriorate the performance of the functional layer.

Therefore, it would be advantageous to improve the salinity (salt) tolerance of the functional layer, together with providing good or improved slipping property and feel.

SUMMARY

Provided is a laminate having both durability and salinity tolerance.

Additional aspects will be set forth in part in the description which follows and, in part, will be apparent from the description, or may be learned by practice of the presented embodiments of the disclosure.

According to an aspect, provided is a laminate including:
a substrate;
a protective layer, and
an intermediate layer provided between the substrate and the protective layer,
wherein the protective layer includes a fluorine-containing (poly)ether amide silane compound represented by Formula 1 and having a molecular weight greater than 2,000 Dalton (Da), and
the intermediate layer includes at least one Si—O bond and has a density greater than about 2.0 grams per cubic centimeter ($g/cm^3$) and less than about 2.5 $g/cm^3$.

$$Rf\text{-}(L1)_{p1}\text{-}Q1\text{-}(L2)_{p2}\text{-}Si(R_1)(R_2)(R_3) \quad \text{Formula 1}$$

wherein, in Formula 1,
Rf is a fluorine-containing (poly)ether group,
Q1 is —N($R_a$)—C(=O)O—, —C(=O)—N($R_a$)—, —N($R_a$)—S(=O)O—, —S(=O)—N($R_a$)—, —OS(=O)—N($R_a$)—C(=O)O—, or —OC(=O)—N($R_a$)—S(=O)O—,

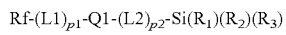

$R_a$ is -(L3)$_{p3}$-Si($R_4$)($R_5$)($R_6$),
L1, L2, and L3 are each independently a substituted or unsubstituted C1-C20 alkylene group, a substituted or unsubstituted C1-C20 oxyalkylene group, or a combination thereof,
p1, p2, and p3 are each independently an integer of 1 to 10,
$R_1$, $R_2$, $R_3$, $R_4$, $R_5$, and $R_6$ are each independently a hydrogen, a substituted or unsubstituted C1-C20 alkoxy group, a halogen atom, a hydroxy group, a substituted or unsubstituted C1-C20 alkyl group, a substituted or unsubstituted $C_1$-$C_0$ alkylthio group, a substituted or unsubstituted C6-C20 aryl group, a substituted or unsubstituted C6-C20 aryloxy group, a substituted or unsubstituted C6-C20 arylthio group, or a combination thereof,
at least one of $R_1$, $R_2$, and $R_3$ is a substituted or unsubstituted C1-C20 alkoxy group, a substituted or unsubstituted C1-C20 alkylthio group, a halogen atom, or a hydroxy group, and at least one of $R_4$, $R_5$, and $R_6$ is a substituted or unsubstituted C1-C20 alkoxy group, a substituted or unsubstituted C1-C20 alkylthio group, a halogen atom, or a hydroxy group.

According to an aspect, provided is a display device including the above-described laminate.

According to an aspect, provided is an article including the display device.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 shows appearance images after exposure to salt water of laminates prepared in Comparative Examples 8 to 16;

DETAILED DESCRIPTION

Figure 1:
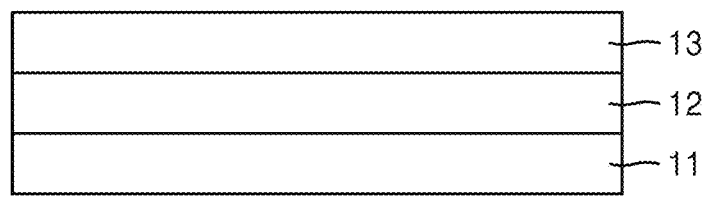
FIG. 1 is a schematic view of a laminate according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list, for example, "at least one of a, b, or c" indicates only a, only b, only c, both a and b, both a and c, both b and c, all of a, b, and c, or variations thereof.

Various example embodiments will now be described more fully with reference to the accompanying drawings. This inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art. Like reference numerals in the drawings denote like elements.

It will be understood that when a component is referred to as being "on" another component, the component can be directly on the other component or intervening components may be present thereon. In contrast, when a component is referred to as being "directly on" another component, an intervening component is not present therebetween.

While such terms as "first," "second," "third", etc., may be used to describe various elements, components, regions, layers, and/or sections, such elements, components, regions, layers, and/or sections must not be limited to the above terms. The above terms are used only to distinguish one element, component, region, layer, or section from another element, component, region, layer, or section. Therefore, a first element, component, region, layer, or section described hereinafter may be referred to as a second element, component, region, layer, or section without departing from the teachings of the present specification.

The terms used in the present specification are merely used to describe particular embodiments, and are not intended to limit the inventive concept. An expression used in the singular encompasses the expression of the plural including "at least one," unless it has a clearly different meaning in the context. The term "at least one" should not be understood as limiting to the singular. As used herein, the term "or" means "and/or," the term "and/or" includes any and all combinations of one or more of the associated list items. It will be further understood that the terms "includes," "comprises," "including," and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented as being "above" the other elements or features. Thus, term such as "below" can encompass both an orientation of above and below. The device may be otherwise oriented (rotated 90 degrees or at other orientations), and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments are described herein with reference to cross-sectional illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated or described as flat may, typically, have rough and/or nonlinear features. Moreover, angles illustrated as sharp may be rounded. Thus, the regions illustrated in the figures are schematic in nature and their shapes are not intended to illustrate the actual shape of a region and are not intended to limit the scope of the present description.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10%, 5% of the stated value.

The term "Group" means a group of the periodic table of the elements according to the Group 1-18 classification system by the International Union of Pure and Applied Chemistry ("IUPAC").

While particular embodiments are described, alternatives, modifications, variations, improvements, and substantial equivalents that are or may be presently unforeseen or unexpected may arise to applicants or those skilled in the art. Accordingly, the appended claims as filed and as they may be amended are intended to embrace all such alternatives, modification, variations, improvements, and substantial equivalents.

Hereinafter, according to one or more embodiments, a laminate, a display device, an article, and a method of manufacturing the article will be described in detail.

Laminate

FIG. 1 is a schematic view illustrating a laminate according to an embodiment.

Referring to FIG. 1, a laminate 10 according to an embodiment includes: a substrate 11; a protective layer 13; and an intermediate layer 12 provided between the substrate 11 and the protective layer 13.

The substrate 11 may be, for example, a ceramic, a glass, or a polymer, but is not limited thereto, and may be selected according to the use or desired physical properties of a final product (or article).

To ensure adhesion with an adjacent layer, the substrate 11 may have a structure formed on the surface thereof or may be surface-treated with laser. However, embodiments are not limited thereto. The structure may be formed on one or all sides of the substrate 11.

An intermediate layer 12 may be stacked on the substrate 11. The intermediate layer 12 may include at least one Si—O bond and may have a density greater than 2.0 g/cm$^3$ and less than 2.5 g/cm³. For example, the intermediate layer 12 may have a density of 2.1 g/cm³ to 2.3 g/cm³, or a density of 2.2 g/cm³ to 2.25 g/cm³.

The intermediate layer 12 may be formed on the substrate by physical-chemical vapor deposition (PVD) of SiO₂ powder onto the substrate. For example, the intermediate layer 12 may be formed by a physical-chemical vapor deposition method using heat, energy beam (E-beam), or sputtering.

According to an embodiment, the intermediate layer 12 may be formed on the surface of the substrate by a physical-chemical deposition method using sputtering of SiO₂ powder. By this method, a thin film that is uniform and has a silanol group exposed on the surface thereof may be formed on the substrate 11.

The intermediate layer 12 may include at least one silanol functional group. For example, the silanol functional group may include isolated silanol, geminal silanol, vicinal silanol, or a combination thereof.

Generally, SiO₂ particles are known to include silanol (Si—OH) groups in the amount of less than about 4.60 per unit area of 1 nm² (hydroxy groups per square nanometers (OH/nm²)) at room temperature. The intermediate layer 12 formed by PVD may include 3 or less silanol functional groups per unit area of 1 nm². For example, the intermediate layer 12 may include, per unit area of 1 nm², 2 to 2.9, or 2 to 2.5 silanol functional groups.

The number of silanol functional groups in the intermediate layer 12 may include more isolated silanol groups and geminal silanol groups than vicinal silanol groups. Without being bound by theory, it is believed that y controlling the number of vicinal silanols, affinity with water provided from salt water may be reduced, and thus generation of a base (OH⁻), which is a product of hydrolysis between water and the SiO₂ material of the intermediate layer 12, may be reduced. Again, without be bound by theory, it is understood that the generated base may cause decomposition of an amide group, which is a material of the protective layer to be described herein, and thus it is important to reduce the generation of the base.

The intermediate layer 12 may be crosslinked to the protective layer 13 by at least one siloxane bond. For example, the siloxane bond may be formed by reaction of the silanol group of the intermediate layer and a silane group of fluorine-containing (poly)ether amide silane compound of the protective layer as described herein.

For example, 6 silanol groups exposed on the surface of the intermediate layer 12 may form 6 siloxane bonds through reaction with one hydrolyzable silane group of the fluorine-containing (poly)ether amide silane compound. The intermediate layer 12 and the protective layer 13 may be strongly bound to each other via this siloxane bond.

In addition, the fluorine-containing (poly)ether group of the fluorine-containing (poly)ether amide silane compound bound to the intermediate layer 12 may be oriented toward a side opposite to the substrate, for example, oriented toward the surface (the air above the layer 13) thereof. For example, the fluorine-containing (poly)ether group-containing amide silane compound may be arranged in a direction substantially perpendicular to the substrate. The film may be disposed on a substrate and may be a non-self standing film that requires a substrate.

The intermediate layer may have a thickness of about 100 nanometers (nm) or less. For example, the thickness of the intermediate layer may be about 90 nm or less, about 80 nm or less, about 70 nm or less, about 60 nm or less, about 50 nm or less, about 40 nm or less, about 30 nm or less, about 20 nm or less, or about 10 nm or less. For example, the thickness of the intermediate layer may be about 1 nm or greater, about 2 nm or greater, about 3 nm or greater, about 4 nm or greater, or about 5 nm or greater. For example, the thickness of the intermediate layer may be about 1 nm to about 100 nm, about 1 nm to about 90 nm, about 2 nm to about 80 nm, about 3 nm to about 70 nm, about 4 nm to about 60 nm, about 5 nm to about 50 nm, about 6 nm to about 40 nm, about 7 nm to about 30 nm, about 8 nm to about 20 nm, or about 10 nm to about 20 nm.

The protective layer 13 may be disposed on the intermediate layer 12.

The protective layer 13 may include a fluorine-containing (poly)ether amide silane compound represented by Formula 1 and having a weight average molecular weight greater than 2,000 Da. In Formula 1:

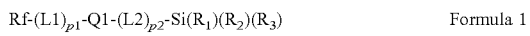

$$Rf\text{-}(L1)_{p1}\text{-}Q1\text{-}(L2)_{p2}\text{-}Si(R_1)(R_2)(R_3) \qquad \text{Formula 1}$$

Rf may be a fluorine-containing (poly)ether group,

Q1 may be —N($R_a$)—C(=O)O—, —C(=O)—N($R_a$)—, —N($R_a$)—S(=O)O—, —S(=O)—N($R_a$)—, —OS(=O)—N($R_a$)—C(=O)O—, or —OC(=O)—N($R_a$)—S(=O)O—, $R_a$ may be -(L3)$_{p3}$-Si($R_4$)($R_5$)($R_6$), L1, L2, and L3 may each independently be a substituted or unsubstituted C1-C20 alkylene group, a substituted or unsubstituted C1-C20 oxyalkylene group, or a combination thereof, p1, p2, and p3 may each independently be an integer of 1 to 10, $R_1$, $R_2$, $R_3$, $R_4$, $R_5$, and $R_6$ may each independently hydrogen, a substituted or unsubstituted C1-C20 alkoxy group, halogen atom, a hydroxy group, a substituted or unsubstituted C1-C20 alkyl group, a substituted or unsubstituted C1-C20 alkylthio group, a substituted or unsubstituted C6-C20 aryl group, a substituted or unsubstituted C6-C20 aryloxy group, a substituted or unsubstituted C6-C20 arylthio group, or a combination thereof, at least one of $R_1$, $R_2$, and $R_3$ may be a substituted or unsubstituted C1-C20 alkoxy group, a substituted or unsubstituted C1-C20 alkylthio group, a halogen atom, or a hydroxy group, and at least one of $R_4$, $R_5$, and $R_6$ may be a substituted or unsubstituted C1-C20 alkoxy group, a substituted or unsubstituted C1-C20 alkylthio group, a halogen atom, or a hydroxy group.

Formula 1 and its method of manufacture will be further described below.

The fluorine-containing (poly)ether amide silane compound represented by Formula 1 may be provided on the intermediate layer 12 through deposition by coating or a dry process to form the protective layer. For example, the protective layer 13 may be obtained by, for example, spin-coating, slit-coating, inkjet-printing, or dipping the intermediate layer 12 in a solution including the silane compound having a fluorine-containing (poly)ether group and then drying. In an embodiment, the protective layer 13 may be formed on the intermediate layer 12 in a chamber by thermal deposition, vacuum deposition, or chemical vapor deposition of the silane compound having a fluorine-containing (poly)ether group.

For example, in deposition coating, the chamber is in a vacuum condition, and thus is in a substantially anhydrous condition. The silane compound vaporized in the chamber contacts the substrate, and thus it is difficult to conduct a hydrolysis reaction and/or condensation polymerization reaction in the presence of silane compound alone. In deposition coating, the reaction efficiency of the hydrolysis reaction and/or condensation polymerization reaction on the surface of the substrate by the silane compound alone may be reduced. Thus, a coating film obtained from such hydrolysis reaction and/or condensation polymerization reaction may also have a reduced durability. However, when the intermediate layer 12 is formed on the substrate 11 and thereafter, the silane compound contacts the intermediate layer 12, a hydrolysis reaction and/or condensation polymerization reaction of the hydrolyzable silane group of the silane compound with the silanol group present on the surface of the intermediate layer 12 may be facilitated, significantly improving the reaction efficiency of the hydrolysis reaction and/or condensation polymerization reaction of the silane compound. Consequently, the obtained coating film has improved durability.

The silane compound represented by Formula 1 may include, as a linker, a tertiary amide group between a fluorine-containing (poly)ether moiety and a hydrolyzable silane group. This may increase the steric hinderance of the silane compound, thus suppressing the decomposition reaction of an amide bond by reaction of OH— in salt water and an amide group linker. As a result, damage and/or cracking of the protective layer may be reduced or prevented. Accordingly, it is possible to prevent the protective layer from being easily worn by frequent friction and enhance durability.

In an embodiment, the silane compound represented by Formula 1 may include 6 silane groups at maximum, and one molecule of the silane compound forms 6 covalent bonds with the intermediate layer 12, for example, siloxane bonds, thereby strongly binding the protective layer 13 to the substrate.

The siloxane compound represented by Formula 1 forms siloxane bonds with the intermediate layer 11 through two silane groups at one terminal end thereof, and thus may be strongly bound to the substrate. In the prior art, the functional groups for the binding of a silane compound on the substrate are insufficient. However, the laminate according to an embodiment of the present invention provides, by the introduction of the intermediate layer 12 on the substrate 11, a plurality of silanol groups capable of binding with the silane group of the protecting layer, and it is possible to coat a larger amount of the silane compound or a larger-molecular weight silane compound. For example, the fluorine-containing (poly)ether amide silane compound may have a weight average molecular weight of about 4000 Da or more and about 7000 Da or less. For example, the fluorine-containing (poly)ether amide silane compound may have a weight average molecular weight about 4000 Da to about 7000 Da, about 4500 Da to about 6500 Da, about 5000 Da to about 6000 Da, or about 5500 Da to about 6500 Da.

When the fluorine-containing (poly)ether amide silane compound has a molecular weight within the above range, the degree of diffusion of salt water may be reduced due to an increase in the thickness of the protective layer, and thus, damage to the intermediate layer 12 and the substrate 11 located under the protective layer 13 may be prevented.

The fluorine-containing (poly)ether amide silane compound may include a tertiary amide linker and may have a bulky structure, as compared with the case including a secondary amide linker. A ratio of the pore area to the surface area of the protective layer may be about 0.45 or less. For example, the ratio of the pore area to the surface area of the protective layer may be about 0.40 or less, about 0.35 or less, about 0.30 or less, about 0.25 or less, about 0.20 or less, about 0.18 or less, or about 0.17 or less. For example, the ratio of the pore area to the surface area of the protective layer may be about 0.01 to about 0.45, about 0.01 to about 0.40, about 0.01 to about 0.35, about 0.01 to about 0.30, about 0.01 to about 0.25, about 0.01 to about 0.20, about 0.01 to about 0.18, or about 0.01 to about 0.17.

When the protective layer has a ratio of the pore area within the above ranges, diffusion of salt water may be delayed and/or suppressed, preventing hydrolysis reaction of the amide group by a base. As a result, damage and/or destruction of the protective layer may be suppressed.

The protective layer may have a thickness of, for example, about 1 micrometer (μm) or less, about 500 nm or less, about 100 nm or less, about 50 nm or less, about 40 nm or less, about 30 nm or less, about 20 nm or less, or about 15 nm or less. For example, the protective layer may have a thickness of about 1 nm to about 1 μm, about 10 nm to about 800 nm, about 20 nm to about 500 nm, about 30 nm to about 200 nm, about 40 nm to about 100 nm, or about 50 nm to about 100 nm.

The protective layer may be a functional layer having anti-fingerprint coating property and may function to protect the underlying film from external environments. The anti-fingerprint coating property may be quantized, for example, by analysis of a water contact angle or diiodomethane contact angle at room temperature, for example, at 25° C.

The contact angle of the protective layer may be measured using water. The protective layer may have a fluorine-containing (poly)ether group on the surface thereof, and may have a high contact angle. In an embodiment, the protective layer may have improved surface slipping property and water repellency. The protective layer may have a contact angle of about 100° or greater, for example, a contact angle of about 105° or greater, for example, about 110° or greater, for example, about 115° or greater. For example, the protective layer may have a contact angle of about 100° to about 180°, about 105° to about 170°, about 110° to about 170°, about 115° to about 160°, about 120° to about 150°, and about 130° to about 140°. In an embodiment, the contact angle may be measured using a Sessile drop technique. Liquid used in the contact angle measurement may be water, and the contact angle may be measured using a drop shape analyzer (DSA100, KRUSS, Gerjaiy) by dropping a certain amount (~3 μl) of water onto the surface of the protective layer.

The protective layer may maintain a high contact angle even after frequent friction. The durability of the protective layer may be confirmed by a change in contact angle after multiple times of friction. For example, after an eraser abrasion test (5,000 times) at a load of 1 kilograms (kg), the film, for example the protective layer, may have a contact angle change of about 20° or less, about 18° or less, about 15° or less, about 12° or less, about 10° or less. For example, about 0° to about 20°, about 0° to about 18°, about 0° to about 15°, about 0° to about 12°, or about 0° to about 10°. For example, after an eraser abrasion test (1,000 times) at a load of 1 kg, the film, for example the protective layer, may have a contact angle of about 95° or greater. For example, after an eraser abrasion test (1,000 times) at a load of 1 kg, the protective layer may have a contact angle of about 95° to about 180°, about 105° to about 170°, about 110° to about 170°, about 115° to about 160°, about 120° to about 150°, and about 130° to about 140°. For example, even after an eraser abrasion test (2,000 times) at a load of 1 kg, the film, for example the protective layer may have a contact angle of about 50° or greater, for example, about 50° to about 180°, about 105° to about 170°, about 110° to about 170°, about 115° to about 160°, about 120° to about 150°, and about 130° to about 140°.

In an embodiment, the contact angle of the protective layer may be measured using diiodomethane. In an embodiment, the protective layer may have, for example, a contact angle of about 90° or greater, for example, a contact angle of about 95° or greater or about 97° or greater. For example, the protective layer may have a contact angle of about 90° to about 180°, about 95° to about 170°, about 97° to about 170°, about 115° to about 160°, about 120° to about 150°, and about 130° to about 140°. In an embodiment, the contact angle may be measured using a Sessile drop technique. Liquid used in the contact angle measurement may be diiodomethane, and the contact angle may be measured using a drop shape analyzer (DSA100, KRUSS, Gerjaiy) by dropping a certain amount (~2.7 µl) of diiodomethane onto the surface of the protective layer.

Hereinafter, the fluorine-containing (poly)ether amide silane compound constituting the protective layer and its manufacture will be described in more detail.

The fluorine-containing (poly)ether amide silane compound represented by Formula 1 may have a structure including a perfluoroether(poly)ether (PFPE) group as the fluorine-containing (poly)ether group, the PFPE group being bound to a hydrolysable silane group by an amide bond (—C(=O)—NH—).

The silane compound represented by Formula 1 may include at least one hydrolyzable functional group substituted at silicon (Si). The silane substituted with a hydrolyzable functional group may be, for example, a silane substituted with at least one substituted or unsubstituted C1-C20 alkoxy group, a halogen atom, or a hydroxy group. The hydrolyzable silane group may be bound to the intermediate layer 12 by hydrolysis and/or condensation polymerization reaction during coating or deposition. The binding may be covalent bonding, for example, siloxane bonding. The hydrolyzable silane group may have a hydrolyzable functional group, and thus may form a network of hydrolytes and/or polycondensates of silane through the hydrolysis and polycondensation reaction of the polymerizable silane group during coating. The polymerizable functional group may be, for example, a C1-C10 alkoxy group, a C1-C20 alkylthio group, a halogen atom, or a hydroxy group, and may be, for example, a C1-C8 alkoxy group, a C1-C20 alkylthio group, for example, a methoxy group or an ethoxy group. Particularly, the methoxy group has a high hydrolysis reactivity.

$R_a$ in Formula 1 may be -(L3)$_{p3}$-Si(R$_4$)(R$_5$)(R$_6$). In an embodiment, the silane compound of Formula 1, having a fluorine-containing (poly)ether group, includes at least two silane groups, and thus a bond between adjacently-bound silane compounds may be stronger than that of a compound including one silane group. Therefore, a film formed using the silane compound may have further improved abrasion resistance. While not wishing to be bound by theory, it is understood that as a hydrogen bond between amide bonds is formed, strength of a bond between the silane compounds may further increase.

The fluorine-containing (poly)ether group included in the silane compound of Formula 1 may have, for example, a structure having a CF$_3$(CF$_2$)$_h$O group at a terminal end thereof and in which —(CF$_2$CF$_2$O)$_i$—, —(CF$_2$O)$_j$—, and —(CH$_2$O)$_k$— are bound to the CF$_3$(CF$_2$)$_h$O group in any order, wherein h and k are each independently an integer of 0 to 10, and i and j are each independently an integer of 1 to 100.

The fluorine-containing (poly)ether group included in the silane compound of Formula 1 may have, for example, a structure having a CF$_3$O group, a CF$_3$CF$_2$O group, or a CF$_3$CF$_2$CF$_2$O group at a terminal end thereof and in which —(CF$_2$CF$_2$O)$_i$—, —(CF$_2$O)$_j$—, and —(CH$_2$O)$_k$— are bound to the CF$_3$O, CF$_3$CF$_2$O, or CF$_3$CF$_2$CF$_2$O group in any order, wherein k is an integer of 0 to 10, and i and j are each independently an integer of 1 to 100. The order refers to, for example, the order in which —(CF$_2$CF$_2$O)$_i$—, —(CF$_2$O)$_j$—, and —(CH$_2$O)$_k$— are bound to the CF$_3$O group, CF$_3$CF$_2$O group, or CF$_3$CF$_2$ CF$_2$O group, wherein j and i are each independently, for example, an integer of 1 to 60, an integer of 5 to 55, an integer of 10 to 50, or an integer of 15 to 40, a ratio of i and j may be, for example, 0.5 to 1.5, 0.6 to 1.4, 0.7 to 1.3, 0.8 to 1.2, 0.9 to 1.1, or about 1, and. k may be, for example, 0 or an integer of 1 to 9, or an integer of 2 to 5.

In the silane compound of Formula 1, Rf may be
CF$_3$O—(CF$_2$CF$_2$O)$_i$—(CF$_2$O)$_j$—(CH$_2$O)$_k$—,
CF$_3$O—(CF$_2$O)$_j$—(CF$_2$CF$_2$O)$_i$—(CH$_2$O)$_k$—,
CF$_3$CF$_2$O—(CF$_2$CF$_2$O)$_i$—(CF$_2$O)$_j$—(CH$_2$O)$_k$—,
CF$_3$CF$_2$O—(CF$_2$O)$_j$—(CF$_2$CF$_2$O)$_i$—(CH$_2$O)$_k$—,
CF$_3$CF$_2$CF$_2$O—(CF$_2$CF$_2$O)$_i$—(CF$_2$O)$_j$—(CH$_2$O)$_k$—, or
CF$_3$CF$_2$CF$_2$O—(CF$_2$O)$_j$—(CF$_2$CF$_2$O)$_i$—(CH$_2$O)$_k$—,
and i and j are each independently, for example, an integer of 1 to 60, an integer of 5 to 55, an integer of 10 to 50, or an integer of 15 to 40, a ratio of i and j may be, for example, 0.5 to 1.5, 0.6 to 1.4, 0.7 to 1.3, 0.8 to 1.2, 0.9 to 1.1, or about 1, and k may be, for example, 0 or an integer of 1 to 9, or an integer of 2 to 5.

In the silane compound of Formula 1, Rf may each independently be
CF$_3$O(CF$_2$CF$_2$O)$_i$(CF$_2$O)$_j$CH$_2$—,
CF$_3$O(CF$_2$CF$_2$O)$_i$(CF$_2$O)$_j$CH$_2$OCH$_2$—, or
CF$_3$O(CF$_2$CF$_2$O)$_i$(CF$_2$O)$_j$CF$_2$—, wherein i and j are each independently, for example, an integer of 1 to 60, an integer of 5 to 55, an integer of 10 to 50, or an integer of 15 to 40, a ratio of i and j may be, for example, 0.5 to 1.5, 0.6 to 1.4, 0.7 to 1.3, 0.8 to 1.2, 0.9 to 1.1, or about 1, and k may be, for example, 0 or an integer of 1 to 9, or an integer of 2 to 5.

The silane compound represented by Formula 1, having a fluorine-containing (poly)ether group, may be, for example, a silane compound having a fluorine-containing (poly)ether group and represented by Formula 2:

$$CF_3(CF_2)_hO(CF_2CF_2O)_i(CF_2O)(CH_2O)_k—CR_{13}R_{14}{}_{p1}—C(=O)—N(R_a)—(CH_2)_{p2}—Si(R_1)(R_2)(R_3).$$  Formula 2

In Formula 2, $R_a$ may be —(CH$_2$)$_{p3}$—Si(R$_4$)(R$_5$)(R$_6$); $R_{13}$ and $R_{14}$ may each independently be hydrogen, a C1-C5 alkyl, fluorine, or a fluorinated C1-C5 alkyl group; p1, p2, and p3 may each independently be an integer of 1 to 10; h and k may each independently be an integer of 0 to 10, i and j may each independently be an integer of 1 to 100, $R_1$, $R_2$, $R_3$, $R_4$, $R_5$, and $R_6$ may each independently be hydrogen, a substituted or unsubstituted C1-C20 alkoxy group, a substituted or unsubstituted C1-C20 alkylthio group, a halogen atom, a hydroxy group, a substituted or unsubstituted C1-C20 alkyl group, a substituted or unsubstituted C6-C20 aryl group, a substituted or unsubstituted C6-C20 aryloxy group, a substituted or unsubstituted C6-C20 arylthio group, or a combination thereof, wherein at least one of $R_1$, $R_2$, and $R_3$ is a substituted or unsubstituted C1-C20 alkoxy group, a halogen atom, or a hydroxy group, and at least one of $R_4$, $R_5$, and $R_6$ is a substituted or unsubstituted C1-C20 alkoxy group, a substituted or unsubstituted C1-C20 alkylthio group, a halogen atom, or a hydroxy group.

For example, p1, p2, and p3 may each independently be an integer of 1 to 9, an integer of 1 to 5, an integer of 1 to 3, or an integer of 1 to 2. i and j may each independently be, for example, an integer of 1 to 60, an integer of 5 to 55, an integer of 10 to 50, or an integer of 15 to 40, a ratio of i and j may be, for example, 0.5 to 1.5, 0.6 to 1.4, 0.7 to 1.3, 0.8 to 1.2, 0.9 to 1.1, or about 1, and k may be, for example, 0 or an integer of 1 to 9, or an integer of 2 to 5.

The fluorine-containing (poly)ether amide silane compound, represented by Formula 1, may be, for example, $CF_3O(CF_2CF_2O)_i(CF_2O)_j—(CH_2)—C(=O)N(—(CH_2)_2—Si(OCH_3)(OCH_3)(OCH_3))_2$, $CF_3O(CF_2CF_2O)_i(CF_2O)_j—(CH_2OCH_2)—C(=O)N(—(CH_2)_2—Si(OCH_3)(OCH_3)(OCH_3))_2$, $CF_3O(CF_2CF_2O)_i(CF_2O)_j—(CF_2)—C(=O)N(—(CH_2)_2—Si(OCH_3)(OCH_3)(OCH_3))_2$, $CF_3O(CF_2CF_2O)_i(CF_2O)_j—(CH_2)—C(=O)N(—(CH_2)_2—Si(OCH_3)(OCH_3)(CH_3))_2$, $CF_3O(CF_2CF_2O)_i(CF_2O)_j—(CH_2OCH_2)—C(=O)N(—(CH_2)_2—Si(OCH_3)(OCH_3)(CH_3))_2$, $CF_3O(CF_2CF_2O)_i(CF_2O)_j—(CF_2)—C(=O)N(—(CH_2)_2—Si(OCH_3)(OCH_3)(CH_3))_2$, $CF_3CF_2O(CF_2CF_2O)_i(CF_2O)_j—(CH_2)—C(=O)N(—(CH_2)_2—Si(OCH_3)(OCH_3)(OCH_3))_2$, $CF_3CF_2O(CF_2CF_2O)_i(CF_2O)_j—(CH_2OCH_2)—C(=O)N(—(CH_2)_2—Si(OCH_3)(OCH_3)(OCH_3))_2$, $CF_3CF_2O(CF_2CF_2O)_i(CF_2O)_j—(CF_2)—C(=O)N(—(CH_2)_2—Si(OCH_3)(OCH_3)(OCH_3))_2$, $CF_3CF_2O(CF_2CF_2O)_i(CF_2O)_j—(CH_2)—C(=O)N(—(CH_2)_2—Si(OCH_3)(OCH_3)(CH_3))_2$, $CF_3CF_2O(CF_2CF_2O)_i(CF_2O)_j—(CH_2OCH_2)—C(=O)N(—(CH_2)_2—Si(OCH_3)(OCH_3)(CH_3))_2$, $CF_3CF_2O(CF_2CF_2O)_i(CF_2O)_j—(CF_2)—C(=O)N(—(CH_2)_2—Si(OCH_3)(OCH_3)(CH_3))_2$, $CF_3CF_2CF_2O(CF_2CF_2O)_i(CF_2O)_j—(CH_2)—C(=O)N(—(CH_2)_2—Si(OCH_3)(OCH_3)(OCH_3))_2$, $CF_3CF_2CF_2O(CF_2CF_2O)_i(CF_2O)_j—(CH_2OCH_2)—C(=O)N(—(CH_2)_2—Si(OCH_3)(OCH_3)(OCH_3))_2$, $CF_3CF_2CF_2O(CF_2CF_2O)_i(CF_2O)_j—(CF_2)—C(=O)N(—(CH_2)_2—Si(OCH_3)(OCH_3)(OCH_3))_2$, $CF_3CF_2CF_2O(CF_2CF_2O)_i(CF_2O)_j—(CH_2)—C(=O)N(—(CH_2)_2—Si(OCH_3)(OCH_3)(CH_3))_2$, $CF_3CF_2CF_2O(CF_2CF_2O)_i(CF_2O)_j—(CH_2OCH_2)—C(=O)N(—(CH_2)_2—Si(OCH_3)(OCH_3)(CH_3))_2$, $CF_3CF_2CF_2O(CF_2CF_2O)_i(CF_2O)_j—(CF_2)—C(=O)N(—(CH_2)_2—Si(OCH_3)(OCH_3)(CH_3))_2$, $CF_3O(CF_2CF_2O)_i(CF_2O)_j—(CH_2)—C(=O)N(—(CH_2)_3—Si(OCH_3)(OCH_3)(OCH_3))_2$, $CF_3O(CF_2CF_2O)_i(CF_2O)_j—(CH_2OCH_2)—C(=O)N(—(CH_2)_3—Si(OCH_3)(OCH_3)(OCH_3))_2$, $CF_3O(CF_2CF_2O)_i(CF_2O)_j—(CF_2)—C(=O)N(—(CH_2)_3—Si(OCH_3)(OCH_3)(OCH_3))_2$, $CF_3O(CF_2CF_2O)_i(CF_2O)_j—(CH_2)—C(=O)N(—(CH_2)_3—Si(OCH_3)(OCH_3)(CH_3))_2$, $CF_3O(CF_2CF_2O)_i(CF_2O)_j—(CH_2OCH_2)—C(=O)N(—(CH_2)_3—Si(OCH_3)(OCH_3)(CH_3))_2$, $CF_3O(CF_2CF_2O)_i(CF_2O)_j—(CF_2)—C(=O)N(—(CH_2)_3—Si(OCH_3)(OCH_3)(CH_3))_2$, $CF_3CF_2O(CF_2CF_2O)_i(CF_2O)_j—(CH_2)—C(=O)N(—(CH_2)_3—Si(OCH_3)(OCH_3)(OCH_3))_2$, $CF_3CF_2O(CF_2CF_2O)_i(CF_2O)_j—(CH_2OCH_2)—C(=O)N(—(CH_2)_3—Si(OCH_3)(OCH_3)(OCH_3))_2$, $CF_3CF_2O(CF_2CF_2O)_i(CF_2O)_j—(CF_2)—C(=O)N(—(CH_2)_3—Si(OCH_3)(OCH_3)(OCH_3))_2$, $CF_3CF_2O(CF_2CF_2O)_i(CF_2O)_j—(CH_2)—C(=O)N(—(CH_2)_3—Si(OCH_3)(OCH_3)(CH_3))_2$, $CF_3CF_2O(CF_2CF_2O)_i(CF_2O)_j—(CH_2OCH_2)—C(=O)N(—(CH_2)_3—Si(OCH_3)(OCH_3)(CH_3))_2$, $CF_3CF_2O(CF_2CF_2O)_i(CF_2O)_j—(CF_2)—C(=O)N(—(CH_2)_3—Si(OCH_3)(OCH_3)(CH_3))_2$, $CF_3CF_2CF_2O(CF_2CF_2O)_i(CF_2O)_j—(CH_2)—C(=O)N(—(CH_2)_3—Si(OCH_3)(OCH_3)(OCH_3))_2$, $CF_3CF_2CF_2O(CF_2CF_2O)_i(CF_2O)_j—(CH_2OCH_2)—C(=O)N(—(CH_2)_3—Si(OCH_3)(OCH_3)(OCH_3))_2$, $CF_3CF_2CF_2O(CF_2CF_2O)_i(CF_2O)_j—(CF_2)—C(=O)N(—(CH_2)_3—Si(OCH_3)(OCH_3)(OCH_3))_2$, $CF_3CF_2CF_2O(CF_2CF_2O)_i(CF_2O)_j—(CH_2)—C(=O)N(—(CH_2)_3—Si(OCH_3)(OCH_3)(CH_3))_2$, $CF_3CF_2CF_2O(CF_2CF_2O)_i(CF_2O)_j—(CH_2OCH_2)—C(=O)N(—(CH_2)_3—Si(OCH_3)(OCH_3)(CH_3))_2$, or $CF_3CF_2CF_2O(CF_2CF_2O)_i(CF_2O)_j—(CF_2)—C(=O)N(—(CH_2)_3—Si(OCH_3)(OCH_3)(CH_3))_2$, wherein i and j are each independently an integer of 1 to 100, an integer of 1 to 60, an integer of 5 to 55, an integer of 10 to 50, or an integer of 15 to 40, and a ratio of i and j may be, for example, 0.5 to 1.5, 0.6 to 1.4, 0.7 to 1.3, 0.8 to 1.2, 0.9 to 1.1, or about 1.

The laminate according to an embodiment may include: an intermediate layer on a substrate, the intermediate layer may include $SiO_2$ with a Si—O bond and may have a density greater than 2.0 $g/cm^3$ and less than 2.5 $g/cm^3$; and a protective layer on the intermediate layer, the protective layer may have a molecular weight greater than 2,000 Da and in which a fluorine-containing (poly)ether moiety and a silane moiety may be linked by a tertiary amide group, thereby may have improvements both in abrasion resistance and salinity tolerance.

in an embodiment, the silane compound constituting the protective layer includes at least two silane moieties, and thus forms more covalent bonds (for example, siloxane bonds) with the silanol group present in the intermediate layer, thus facilitating introduction of the silane compound having an increased molecular weight into the protective layer, resulting in an increased thickness of the protective layer and an elongated diffusion path of salt water. By introduction of a tertiary amine group, affinity with water and solubility in water are reduced, resulting in reduction in water permeability. By control of the density of the intermediate layer to be greater than 2.0 $g/cm^3$ and less than 2.5 $g/cm^3$, hydrophilic groups are reduced, so that diffusion of salt water and water permeability are reduced.

In an embodiment, when base ($OH^-$) generation reaction by reaction of $SiO_2$ and water in the intermediate layer is suppressed, damage and/or abrasion of the protective layer caused by decomposition of the amide group of the silane compound constituting the protective layer may be prevented.

In an embodiment, when the laminate according to an embodiment is used on a surface of a panel equipped in a display device, the laminate may provide salinity tolerance and anti-fingerprint function, and provide improved abrasion resistance and durability. The panel provided in the display device may be, for example, a touch screen provided in a portable terminal, a panel provided in a liquid display device (LCD), or a panel provided in a plasma display panel (PDP).

Display Device

A display device according to an embodiment includes the above-described laminate. By inclusion of the laminate, the display device may have improved durability.

Figure 2:
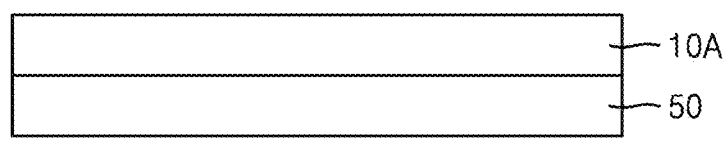
FIG. 2 is a schematic view of a display device including a laminate according to an embodiment.

Referring to FIG. 2, a display device 100 according to an embodiment includes a display panel 50 and a laminate 10A. The display panel 50 may be, for example, an organic light-emitting display panel or a liquid crystal display panel. The display panel 50 may be, for example, a bendable display panel, a foldable display panel, or a rollable display panel. The laminate 10A may be arranged on a viewer side. Another layer may be additionally arranged between the display panel 50 and the laminate 10A. For example, a single layer or a plurality of polymer layers (not shown), and optionally a transparent adhesive layer (not shown) may be further arranged between the display panel 50 and the laminate 10A.

Figure 3:
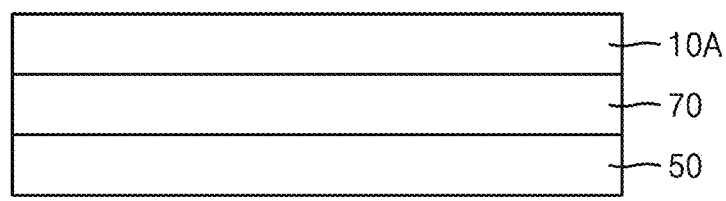
FIG. 3 is a schematic view of a display device including a laminate according to an embodiment.

Referring to FIG. 3, a display panel 200 according to an embodiment may include a display panel 50, a laminate 10A, and a touch screen panel 70 between the display panel 50 and the laminate 10A. The display panel 50 may be, for example, an organic light-emitting display panel or a liquid crystal display panel. The display panel 50 may be, for example, a bendable display panel, a foldable display panel, or a rollable display panel. The laminate 10A may be arranged on a viewer side.

The touch screen panel 70 may be arranged adjacent to the laminate 10A and the display panel 50 to recognize a touch position and a positional change when touched via the laminate 10A by a human hand or an object and output a touch signal. A driving module (not shown) identifies the touch position from the output touch signal, checks an icon displayed at the identified touch position, and may perform controlling to enable a function corresponding to the identified icon. The result of performance of the function may be displayed on the display panel 50. Another layer may be arranged between the touch screen panel 70 and the laminate 10A (not shown). A single layer or a plurality of polymer layers (not shown) and optionally a transparent adhesive layer (not shown) may be further arranged between the touch screen panel 70 and laminate 10A. Another layer may be arranged between the touch screen panel 70 and the display panel 50 (not shown). A single layer or a plurality of polymer layers (not shown) and optionally a transparent adhesive layer (not shown) may be further arranged between the touch screen panel 70 and the display panel 50. The above-described laminate 10A may be applied to various electronic devices, including a display device, for example, to a smart phone, a tablet PC, a camera, a touch panel, and the like. However, embodiments are not limited thereto.

Article

An article according to an embodiment may have improved durability by inclusion of the above-described laminate.

The laminate may further include one or more layers between the substrate and the intermediate layer and/or the protective layer. The laminate may be a transparent film, for example, a transparent flexible film. For example, the laminate may be attached onto a display panel. In an embodiment, the display panel and the laminate may be directly bound to each other or may be bound by an adhesive agent. The display panel may be, for example, a liquid crystal display panel or an organic light-emitting display panel, but embodiments are not limited thereto. The laminate may be disposed on the viewer side. The article may be, for example, a mobile display device, a fixed display device, an automotive display, an aircraft display, a head-up display (HUD), a mobile sensor, a fixed sensor, or an optical article, but embodiments are not necessarily limited thereto.

Method of Preparing a Laminate

A method of preparing a laminate according to another embodiment may include sequentially arranging an intermediate layer and a protective layer on a substrate.

First, after the substrate is loaded into a chamber, $SiO_2$ powder may be deposited on the substrate by physical chemical deposition (PVD) using heat, energy-beam, or sputtering. For example, the physical chemical deposition may be performed by sputtering under an inert gas atmosphere, for example, an argon gas atmosphere.

For example, Si atoms of the $SiO_2$ powder may contact $O_2$, which is a reaction species, on the surface of the substrate and may form $SiO_2$.

Subsequently, the silane compound having a fluorine-containing (poly)ether group and represented by Formula 1 may be provided, for example, in a liquid state or a gas state, on the substrate to form the protective layer. The protective layer may be formed, for example, by coating using a solution process in which a composition is provided in a liquid state, or by deposition using a dry process in which a composition is provided in a gaseous state. In an embodiment, the protective layer may be a coating film or a deposition film.

The providing of the composition on the intermediate layer in a liquid state to dispose a film may include coating on the substrate, a solution of the above-described composition dissolved or dispersed in a solvent, for example, by spin coating, slit coating, inkjet coating, spray coating, or impregnating, and then drying. In an embodiment, the providing of the composition on the intermediate layer in a gaseous state to dispose a film may include coating on the intermediate layer by, for example, thermal deposition, vacuum deposition, or chemical vapor deposition.

The solvent may be, for example, a fluorinated ether-based solvent. The fluorinated ether-based solvent may be, for example, 1,1,2,2-tetrafluoroethyl-2,2,3,3-tetrafluoropropyl ether, 1,1,2,2,-tetrafluoroethyl-1H,1H,5H-octafluoropentylether, 1,1,2,2-tetrafluoroethyl-2,2,2-trifluoroethyl ether, or a mixture thereof, but embodiments are not limited thereto.

Hereinafter, definitions of substituents used in the formulae of the present specification are provided.

As used herein, substituents of a substituted alkylene group, a substituted oxyalkylene group, a substituted alkoxy group, a substituted alkyl group, and a substituted aryl group may be each independently a halogen atom, a hydroxyl group, a C1 to C5 alkyl group, a C1 to C5 alkoxy group, or a combination thereof.

As used herein, the term "alkyl" refers to a fully saturated branched or unbranched (straight chain or linear) hydrocarbon group.

Non-limiting examples of the alkyl group are a methyl group, an ethyl group, an i-propyl group, an isopropyl group, an n-butyl group, an isobutyl group, a sec-butyl group, an n-pentyl group, an isopentyl group, a neopentyl group, an i-hexyl group, a 3-methylhexyl group, a 2,2-dimethylpentyl group, a 2,3-dimethylpentyl group, and an i-heptyl group.

At least one hydrogen atom of the alkyl group may be substituted with a substituent a halogen atom, a hydroxyl group, an alkoxy group, an alkylthio group, a nitro group, a cyano group, an amino group, an amidino group, a hydrazine, a hydrazone, a carboxyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C6-C30 aryloxy group, a C6-C30 arylthio group, a C7 to C30 arylalkyl group, a C1 to C30 alkoxy group, a C1-C30 alkylthio group, a C1 to C20 heteroalkyl group, a C3 to C20 heterocycloalkyl group, or a combination thereof.

The term "halogen atom" encompasses fluorine, bromine, chlorine, and iodine.

As used herein, the term "alkoxy" refers to alkyl-O—, where the alkyl is the same as defined above. Examples of the alkoxy group may include a methoxy group, an ethoxy group, a propoxy group, a 2-propoxy group, a butoxy group, a tert-butoxy group, a pentyloxy group, a hexyloxy group, a cyclopropoxy group, and a cyclohexyloxy group. At least one hydrogen atom in the alkoxy group may be substituted with the same substituent as described above in connection with the alkyl group.

As used herein, the term "alkylthio" refers to alkyl-S—, where the alkyl is the same as defined above. Examples of the alkylthio group may include a thiomethyl group, a thioethyl group, a thiopropyl group, a 2-thiopropyl group, a thiobutyl group, a thio-tert-butyl group, a thiopentyl group, a thiohexyl group, a thiocyclopropyl group, and a thiocyclohexyl group. At least one hydrogen atom in the alkylthio group may be substituted with the same substituent as described above in connection with the alkyl group.

As used herein, the term "aryl" is used alone or in combination, and refers to an aromatic hydrocarbon group having one or more rings.

The term "aryl" also refers to a group in which an aromatic ring is fused to one or more cycloalkyl rings. Non-limiting examples of the aryl group may include a phenyl group, a naphthyl group, or a tetrahydronaphthyl group. At least one hydrogen atom of the "aryl" group may be substituted with the same substituent as described above in connection with the alkyl group.

The term "aryloxy" used herein refers to aryl-O—, where the aryl is the same as defined above. Non-limiting examples of the aryloxy group may include a phenoxy group, a naphthoxy group, or a tetrahydronaphthyloxy group. At least one hydrogen atom of the "aryloxy" group may be substituted with the same substituent as described above in connection with the alkyl group.

The "arylthio" used herein refers to aryl-S—, where the aryl is the same as defined above. Non-limiting examples of the arylthio group may include a thiophenyl group, a thionaphthyl group, or a thiotetrahydronaphthyl group. At least one hydrogen atom of the "arylthio" group may be substituted with the same substituent as described above in connection with the alkyl group.

Also, as used herein, when a definition is not otherwise provided, 'hetero' may refer to one including 1 to 4 heteroatoms I, O, S, Se, Te, Si, or P. As used herein, when a definition is not otherwise provided, "heterocyclo" as used herein refers to a monovalent saturated monocyclic group having at least one heteroatom N, O, P, Si, or S as a ring-forming atom and 1 to 10 carbon atoms, and non-limiting examples thereof include a tetrahydrofuranyl group, and a tetrahydrothiophenyl group.

The term "room temperature" used herein refers to a temperature of about 25° C.

Hereinafter, embodiments will be described in further detail with reference to the following examples. These examples are provided for illustrative purposes only and are not intended to limit the scope of the present inventive concepts. The wording "'B' was used instead of 'A'" used in describing Synthesis Examples means that an amount of 'A' used was identical to an amount of 'B' used, in terms of a molar equivalent.

EXAMPLES

Preparation of Silane Compound Having a Fluorine-Containing (Poly)Ether Group Case with Three Hydrolysable Groups

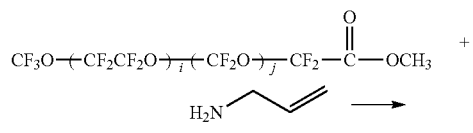

-continued

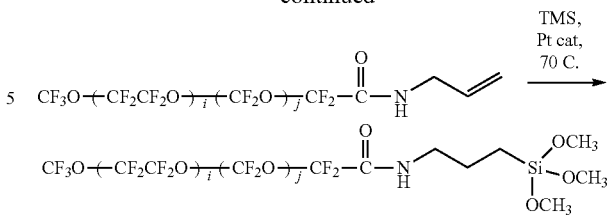

Preparation Example 1

5 gram (g) of $CF_3(CF_2CF_2O)_i(CF_2O)_jCH_2C(O)CH_3$ (i/j≈1, weight average molecular weight (MW)≈1700, Solvay) and 0.336 g of allylamine ($NH_2CH_2CH=CH_2$) were mixed and stirred at 50° C. for 3 hours to obtain intermediate compound 1-1 ($CF_3(CF_2CF_2O)_i(CF_2O)_jCH_2C(O)NHCH_2CH=CH_2$). Excess allylamine remaining after reaction was removed using vacuum. Novec 7200 and intermediate compound 1-1 were mixed together and purified using silica gel.

2 g of intermediate compound 1-1 and 0.213 g of trimethoxysilane were stirred in a xylene solvent in the presence of a Pt(0)-1,3-divinyl-1,1,3,3-tetramethyldisiloxane catalyst at a 70° C. for 12 hours. Excess trimethoxysilane was removed by vacuum and purified using a Celite filter to obtain product 1 of the following formula.

Product 1: $CF_3(CF_2CF_2O)_i(CF_2O)_jCH_2C(O)NHCH_2CH_2CH_2Si(OCH_3)_3$.

Preparation Example 2

20 g of $CF_3(CF_2CF_2O)_i(CF_2O)_jCF_2C(O)CH_3$ (i/j≈1, MW≈4000, Solvay) and 0.9 g of allylamine were mixed and stirred at room temperature for 3 hours to obtain intermediate compound 2-1 ($CF_3(CF_2CF_2O)_i(CF_2O)_jCF_2C(O)NHCH_2CH=CH_2$). Excess allylamine that remained after the reaction was removed in vacuum. Novec 7200 and intermediate compound 2-1 were mixed together and purified using silica gel.

15 g of intermediate compound 2-1 and 0.73 g of trimethoxysilane were stirred in an xylene solvent in the presence of a Pt(0)-1,3-divinyl-1,1,3,3-tetramethyldisiloxane catalyst at a 60° C. for 12 hours. Excess trimethoxysilane was removed by vacuum and purified using a Celite filter to obtain product 2 of the following formula.

Product 2: $CF_3(CF_2CF_2O)_i(CF_2O)_jCF_2C(O)NHCH_2CH_2CH_2Si(OCH_3)_3$.

Preparation Example 3

10 g of $CF_3(CF_2CF_2O)_i(CF_2O)_jCF_2C(O)CH_3$ (i/j≈1, MW≈7000, Solvay) and 0.408 g of arylamine ($NH_2CH_2CH=CH_2$) were mixed and stirred at room temperature at room temperature for 3 hours to obtain intermediate compound 3-1 ($CF_3(CF_2CF_2O)_i(CF_2O)_jCF_2C(O)NHCH_2CH=CH_2$). Excess allylamine remaining after reaction was removed using vacuum. Novec 7200 and intermediate compound 3-1 were mixed together and purified using silica gel.

2 g of intermediate compound 3-1 and 0.39 g of trimethoxysilane were stirred in a xylene solvent in the presence of a Pt(0)-1,3-divinyl-1,1,3,3-tetramethyldisiloxane catalyst at a 70° C. for 12 hours. Excess trimethoxysilane was removed by vacuum and purified using a Celite filter to obtain product 3 of the following formula.

Product 3: $CF_3(CF_2CF_2O)_i(CF_2O)_jCF_2CONHCH_2CH_2CH_2Si(OCH_3)_3$.

Case with 9 Hydrolyzable Groups

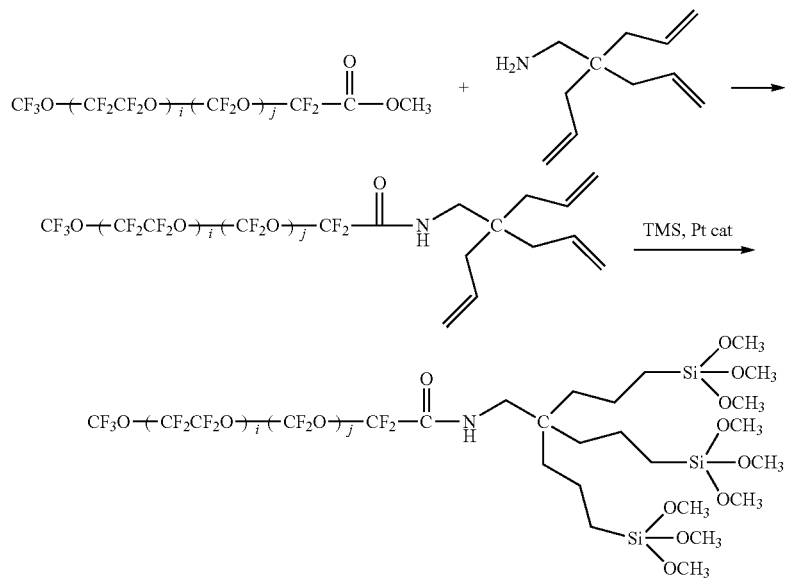

Preparation Example 4

5 g of $CF_3(CF_2CF_2O)_i(CF_2O)_jCH_2C(O)CH_3$ (i/j≈1, MW≈1700, Solvay) and 0.972 g of triallylamine ($NH_2CH_2C(CH_2CH=CH_2)_3$) were mixed and stirred at 70° C. for 3 hours to obtain intermediate compound 4-1 ($CF_3(CF_2CF_2O)_i(CF_2O)_jCH_2C(O)NHCH_2C(CH_2CH=CH_2)_3$). Excess allylamine remaining after reaction was removed using vacuum. Novec 7200 and intermediate compound 4-1 were mixed together and purified using silica gel.

2 g of intermediate compound 4-1 and 0.68 g of trimethoxysilane were stirred in a xylene solvent in the presence of a Pt(0)-1,3-divinyl-1,1,3,3-tetramethyldisiloxane catalyst at 40° C. for 24 hours. Excess trimethoxysilane was removed by vacuum and purified using a Celite filter to obtain product 4 of the following formula.

Product 4: $CF_3(CF_2CF_2O)_i(CF_2O)_jCH_2C(O)NHCH_2C(CH_2CH_2CH_2Si(OCH_3)_3)_3$.

Preparation Example 5

20 g of $CF_3(CF_2CF_2O)_i(CF_2O)_jCF_2C(O)CH_3$ (i/j≈1, MW≈4000, Solvay) and 1.305 g of triallylamine ($NH_2CH_2C(CH_2CH=CH_2)_3$) were mixed and stirred at room temperature for 3 hours to obtain intermediate compound 5-1 ($CF_3(CF_2CF_2O)_i(CF_2O)_jCF_2C(O)NHCH_2C(CH_2CH=CH_2)_3$). Excess allylamine remaining after reaction was removed using vacuum. Novec 7200 and intermediate compound 5-1 were mixed together and purified using silica gel.

13.3 g of intermediate compound 5-1 and 2.108 g trimethoxysilane were stirred in a xylene solvent in the presence of a Pt(0)-1,3-divinyl-1,1,3,3-tetramethyldisiloxane catalyst at 40° C. for 24 hours. Excess trimethoxysilane was removed by vacuum and purified using a Celite filter to obtain product 5 of the following formula.

Product 5: $CF_3(CF_2CF_2O)_i(CF_2O)_jCF_2C(O)NHCH_2C(CH_2CH_2CH_2Si(OCH_3)_3)_3$.

Preparation Example 6

10 g of $CF_3(CF_2CF_2O)_i(CF_2O)_jCF_2C(O)CH_3$ (i/j≈1, MW≈7000, Solvay) and 0.59 g of triallyl amine ($NH_2CH_2C(CH_2CH=CH_2)_3$) were mixed and stirred at 50° C. for 3 hours to obtain intermediate compound 6-1 ($CF_3(CF_2CF_2O)_i(CF_2O)_jCF_2C(O)NHCH_2C(CH_2CH=CH_2)_3$). Excess allylamine remaining after reaction was removed using vacuum. Novec 7200 and intermediate compound 6-1 were mixed together and purified using silica gel.

5 g of intermediate compound 6-1 and 0.437 g of trimethoxysilane were stirred in a xylene solvent in the presence of a Pt(0)-1,3-divinyl-1,1,3,3-tetramethyldisiloxane catalyst at 40° C. for 24 hours. Excess trimethoxysilane was removed by vacuum and purified using a Celite filter to obtain product 6 of the following formula.

Product 6: $CF_3(CF_2CF_2O)_i(CF_2O)_jCF_2C(O)NHCH_2C(CH_2CH_2CH_2Si(OCH_3)_3)_3$.

Case with 6 Hydrolyzable Groups

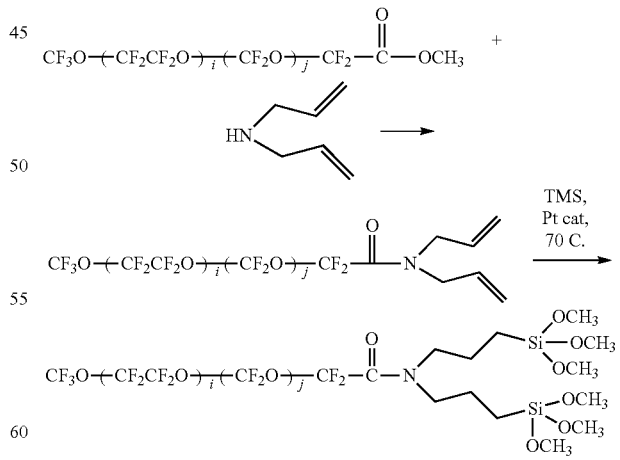

Preparation Example 7

5 g of $CF_3(CF_2CF_2O)_i(CF_2O)_jCH_2C(O)CH_3$ (i/j≈1, MW≈1700, Solvay) and 1.43 g of diallylamine (NH (CH$_2$CH=CH$_2$)$_2$) were mixed and stirred at 70° C. for 12 hours to obtain intermediate compound 7-1 (CF$_3$(CF$_2$CF$_2$O)$_i$ (CF$_2$O)$_j$CH$_2$C(O)N(CH$_2$CH=CH$_2$)$_2$). Excess allylamine remaining after reaction was removed using vacuum. Novec 7200 and intermediate compound 7-1 were mixed together and purified using silica gel.

1 g of intermediate compound 7-1 and 0.204 g of trimethoxysilane were stirred in a xylene solvent in the presence of a Pt(0)-1,3-divinyl-1,1,3,3-tetramethyldisiloxane catalyst at 70° C. for 24 hours. Excess trimethoxysilane was removed by vacuum and purified using a Celite filter to obtain product 7 of the following formula.
Product 7: CF$_3$(CF$_2$CF$_2$O)$_i$(CF$_2$O)$_j$CH$_2$C(O)N(CH$_2$CH$_2$CH$_2$Si(OCH$_3$)$_3$)$_2$.

Preparation Example 8

4K, Tertiary Amide, 6 Hydrolyzable Groups 20 g of CF$_3$(CF$_2$CF$_2$O)$_i$(CF$_2$O)$_j$CF$_2$C(O)CH$_3$ (i/j≈1, MW≈4000, Solvay) and 1.534 g of diallylamine (NH(CH$_2$CH=CH$_2$)$_2$) were mixed and stirred at 60° C. for 12 hours to obtain intermediate compound 8-1 (CF$_3$(CF$_2$CF$_2$O)$_i$ (CF$_2$O)$_j$CF$_2$C(O)N(CH$_2$CH=CH$_2$)$_2$). Excess allylamine remaining after reaction was removed using vacuum. Novec7200 and intermediate compound 8-1 were mixed and purified using silica gel.

12 g of intermediate compound 8-1 and 1.138 g of trimethoxysilane were stirred in a xylene solvent in the presence of a Pt(0)-1,3-divinyl-1,1,3,3-tetramethyldisiloxane catalyst at 60° C. for 24 hours. Excess trimethoxysilane was removed by vacuum and purified using a Celite filter to obtain product 8 of the following formula.
Product 8: CF$_3$(CF$_2$CF$_2$O)$_i$(CF$_2$O)$_j$CF$_2$C(O)N(CH$_2$CH$_2$CH$_2$Si(OCH$_3$)$_3$)$_2$.

Preparation Example 9

7K, Tertiary Amide, 6 Hydrolysable Groups 20 g of CF$_3$(CF$_2$CF$_2$O)$_i$(CF$_2$O)$_j$CF$_2$C(O)CH$_3$ (i/j≈1, MW≈7000, Solvay) and 3.2 g of diallylamine (NH(CH$_2$CH=CH$_2$)$_2$) were mixed and stirred at 60° C. for 12 hours. Excess allylamine remaining after reaction was removed using vacuum. Novec7200 and the intermediate compound were mixed and purified using silica gel to obtain intermediate product 9-1 (CF$_3$(CF$_2$CF$_2$O)$_i$(CF$_2$O)$_j$CF$_2$C(O)N(CH$_2$CH=CH$_2$)$_2$).

12 g of intermediate compound 9-1 and 0.623 g of trimethoxysilane were stirred in a xylene solvent in the presence of a Pt(0)-1,3-divinyl-1,1,3,3-tetramethyldisiloxane catalyst at 70° C. for 24 hours. Excess trimethoxysilane was removed by vacuum and purified using a Celite filter to obtain product 9 of the following formula.
Product 9: CF$_3$(CF$_2$CF$_2$O)$_i$(CF$_2$O)$_j$CF$_2$C(O)N(CH$_2$CH$_2$CH$_2$Si(OCH$_3$)$_3$)$_2$.

Commercially Available Compounds

Preparation Example 10

PFPE-silane having a molecular weight of 4000 Da and represented by Formula CF$_3$(CF$_2$CF$_2$O)$_i$(CF$_2$O)$_j$CF$_2$C(O)CH$_2$CH$_2$CH$_2$Si(OCH$_3$)$_3$ was purchased from Daikin Ltd.

Preparation of Laminate

Example 1

After a silicon wafer was loaded into a vacuum chamber, an intermediate layer, as a SiO$_2$ thin film, having a density of 2.2 g/cm$^3$ was formed on the surface of the silicon wafer through a sputtering process using a silicon source in a mixed atmosphere of argon and oxygen gases. The density of the intermediate layer as a thin film was measured using an XRR (X-ray reflectivity, X'PERT-PRO MRD) equipment.

Subsequently, a protective layer was formed on the intermediate layer by vaporizing a dispersion in which 20% by weight of the silane compound prepared in Preparation Example 8 was dispersed in Novec 7200, with heat to prepare a laminate.

Example 2

A laminate was formed in the same manner as in Example 1, except that the silane compound prepared in Preparation Example 9 was used instead of the silane compound obtained in Preparation Example 8.

Example 3

After a silicon wafer was loaded into a vacuum chamber, an intermediate layer, as a SiO$_2$ thin film, having a density of 2.25 g/cm$^3$, was formed on the surface of the silicon waver by a thermal oxidation process. The density of the intermediate layer as a thin film was measured using an XRR (X-ray reflectivity, X'PERT-PRO MRD) equipment.

Subsequently, a protective layer was formed on the intermediate layer by vaporizing a dispersion in which 20% by weight of the silane compound prepared in Preparation Example 8 was dispersed in Novec 7200, with heat to prepare a laminate.

Comparative Examples 1 to 7

Laminates were formed in the same manner as in Example 1, except that the silane compound prepared in Preparation Example 8 was used instead of the silane compounds prepared in Preparation Examples 1 to 7.

Comparative Example 8

After a silicon wafer was loaded into a vacuum chamber, an intermediate layer, as a SiO$_2$ thin film, having a density of 2.0 g/cm$^3$, was formed on the surface of the silicon wafer through a thermal deposition process using SiO$_2$ granules. The density of the intermediate layer as a thin film was measured using an XRR (X-ray reflectivity, X'PERT-PRO MRD) equipment.

Subsequently, a protective layer was formed on the intermediate layer by vaporizing a dispersion in which 20% by weight of the silane compound prepared in Preparation Example 1 was dispersed in Novec 7200, with heat to prepare a laminate.

Comparative Examples 9 to 16

Laminates were formed in the same manner as in Comparative Example 8, except that the silane compounds prepared in Preparation Examples 2 to 9 was used instead of the silane compound prepared in Preparation Example 1.

Comparative Example 17

After a silicon wafer was loaded into a vacuum chamber, an intermediate layer, as a SiO$_2$ thin film was formed by vaporizing a dispersion in which 20% by weight of the silane compound prepared in Preparation Example 2 was dispersed in Novec 7200, with heat to prepare a laminate including no protective layer.

Comparative Example 18

After a silicon wafer was loaded into a vacuum chamber, an intermediate layer, as a $SiO_2$ thin film, having a density of 2.2 g/cm³ was formed on the surface of the silicon wafer through a sputtering process using a silicon source in a mixed atmosphere of argon and oxygen gases. The density of the intermediate layer as a thin film was measured using an XRR (X-ray reflectivity, X'PERT-PRO MRD) equipment.

Subsequently, a protective layer was formed on the intermediate layer by vaporizing a dispersion in which 20% by weight of PFPE-silane compound represented by Formula $CF_3(CF_2CF_2O)_i(CF_2O)_jCF_2C(O)CH_2CH_2CH_2Si(OCH_3)_3$ (i/j≈1, MW≈4000, purchased from Daikin) was dispersed in Novec 7200 via heat to prepare a laminate.

Comparative Example 19

After a silicon wafer was loaded into a vacuum chamber, an intermediate layer, as a $SiO_2$ thin film, having a density of 2.0 g/cm³, was formed on the surface of the silicon wafer through a thermal deposition process using $SiO_2$ granules, to prepare a laminate including no protectively layer. The density of the $SiO_2$ layer was measured using an XRR (X-ray reflectivity, X'PERT-PRO MRD) equipment.

Comparative Example 20

After a silicon wafer was loaded into a vacuum chamber, an intermediate layer, as a $SiO_2$ thin film, having a density of 2.2 g/cm³ was formed on the surface of the silicon wafer through a sputtering process using a silicon source in a mixed atmosphere of argon and oxygen gases, to thereby prepare a laminate including no protective layer. The density of the $SiO_2$ layer was measured using an XRR (X-ray reflectivity, X'PERT-PRO MRD) equipment.

Comparative Example 21

After a silicon wafer was loaded into a vacuum chamber, a $SiO_2$ layer having a density of 2.25 g/cm³, was formed on the surface of the silicon waver by a thermal oxidation process, to prepare a laminate including no protective layer. The density of the $SiO_2$ layer was measured using an XRR (X-ray reflectivity, X'PERT-PRO MRD) equipment.

Evaluation Example 1: Abrasion Resistance Evaluation

The laminates prepared in Comparative Example 1, and Comparative Examples 17 and 18 were each rubbed with a polyurethane rubber eraser having a 6 mm width and a load of 1 kg until the protective layer on the surface of the laminate was separated, to measure a limit eraser abrasion resistance count.

The results are shown in Table 1.

TABLE 1

| | Limit rubbing frequency [Frequency] |
|---|---|
| Comparative Example 2 | 5000 |
| Comparative Example 17 | 1500 |
| Comparative Example 18 | 3000 |

As shown in Table 1, it was found that as the silane compound of the protective layer includes an amide group, abrasion resistance was improved. In addition, it was found that the limit rubbing frequency was significantly improved in the case of the silane compound of the protective layer, including an amide group and a $SiO_2$ thin film (Comparative Example 2), as compared with the other case (Comparative Example 17).

These experimental results show the improved effect of the combination of the silane compound with amide group and a $SiO_2$ thin film on abrasion resistance.

Evaluation Example 2: Salinity Tolerance Appearance Evaluation

After the laminates prepared in Examples 1 and 3 and Comparative Examples 1 to 16 were each placed in a salinity tolerance test chamber, a 5% NaCl solution was continuously sprayed at a 35° C. or 72 hours, and then water droplets were dropped at 25° C. onto a film using a drop shape analyzer (model DSA100, KRUSS, Germany) to measure a contact angle after salt water spray, and it was then evaluated whether or not the appearance had damage.

Figure 4:
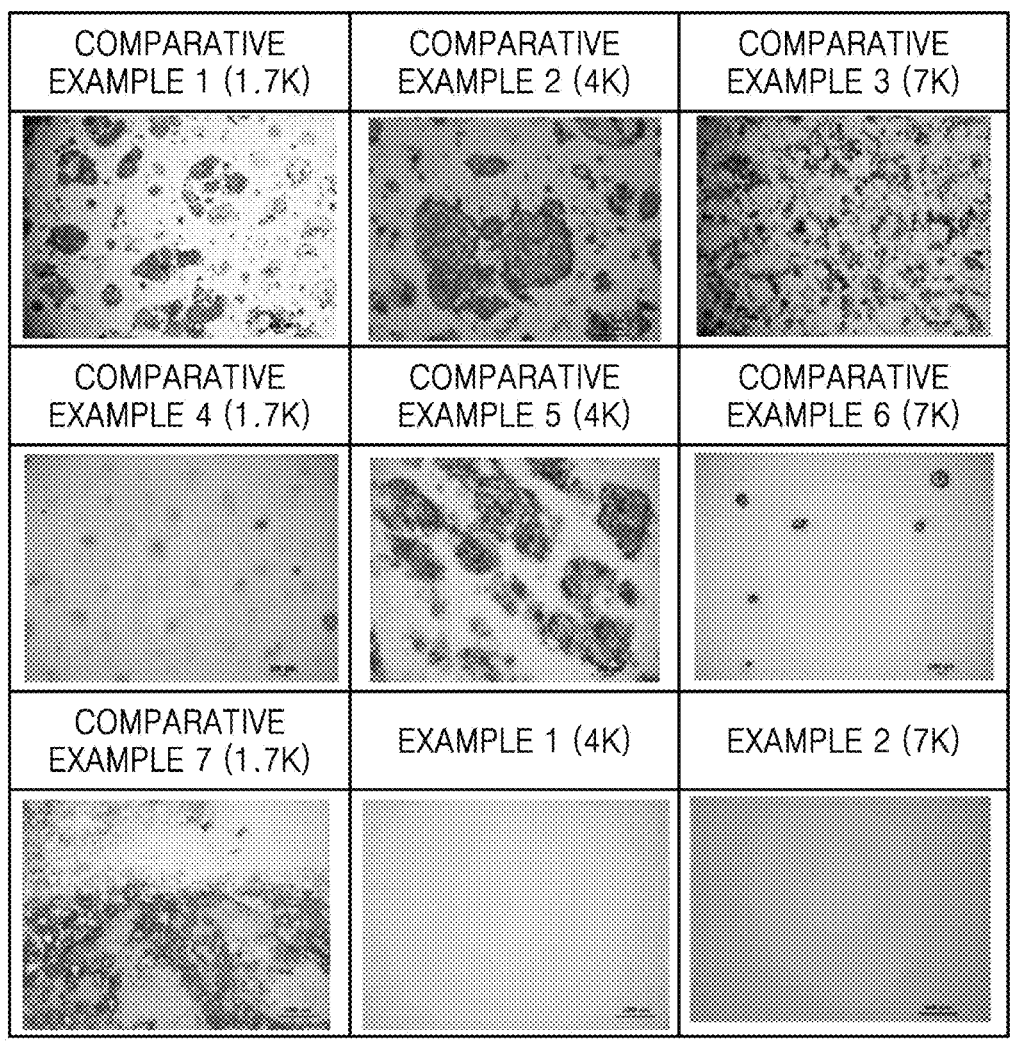
FIG. 4 shows appearance images after exposure to salt water of laminates prepared in Examples 1 and 2, and Comparative Examples 1 to 7.

The measured contact angles are provided in Table 2, and the appearances were imaged and provided in FIG. 4 (at an intermediate layer density of 2.2 g/cm³) and FIG. 5 (at an intermediate layer density of 2.0 g/cm³).

TABLE 2

| | Contact angle (°) |
|---|---|
| Example 1 | 115.9 |
| Example 2 | 116.3 |
| Example 3 | 117 |
| Comparative Example 1 | 90.5 |
| Comparative Example 2 | 96.2 |
| Comparative Example 3 | 79.1 |
| Comparative Example 4 | 112 |
| Comparative Example 5 | 114 |
| Comparative Example 6 | 113.5 |
| Comparative Example 7 | 103 |
| Comparative Example 8 | 46.2 |
| Comparative Example 9 | 101.4 |
| Comparative Example 10 | 101 |
| Comparative Example 11 | 71 |
| Comparative Example 12 | 94.4 |
| Comparative Example 13 | 113.5 |
| Comparative Example 14 | 87.8 |
| Comparative Example 15 | 109.3 |
| Comparative Example 16 | 114 |

Referring to Table 2 and FIGS. 4 and 5, it was found that the larger the molecular weight of the protective layer became, the contact angle was improved. However, when the density of the intermediate layer was 2.0 g/cm³, surface damage was still identified in an appearance evaluation. In an embodiment, when the intermediate layer has a density of about 2.2 g/cm³ or greater and the protective layer has a molecular weight of about 4K or greater, the contact angle was improved and no surface damage was visually identified.

Evaluation Example 3: Evaluation of Protective Layer Delamination

After the laminates prepared in Example 1 and Comparative Example 5 were each placed in a salinity tolerance test chamber, a 5% NaCl solution was continuously sprayed at a 35° C. for 72 hours, and then it was determined whether C—F bonds were present or not through IR spectra measurement, thereby evaluating the degree of delamination of the protective layer. In addition, for ease of comparison, IR spectra of a Si substrate (Reference Example 1) and the laminate of Comparative Example 20 were also measured.

Figure 6:
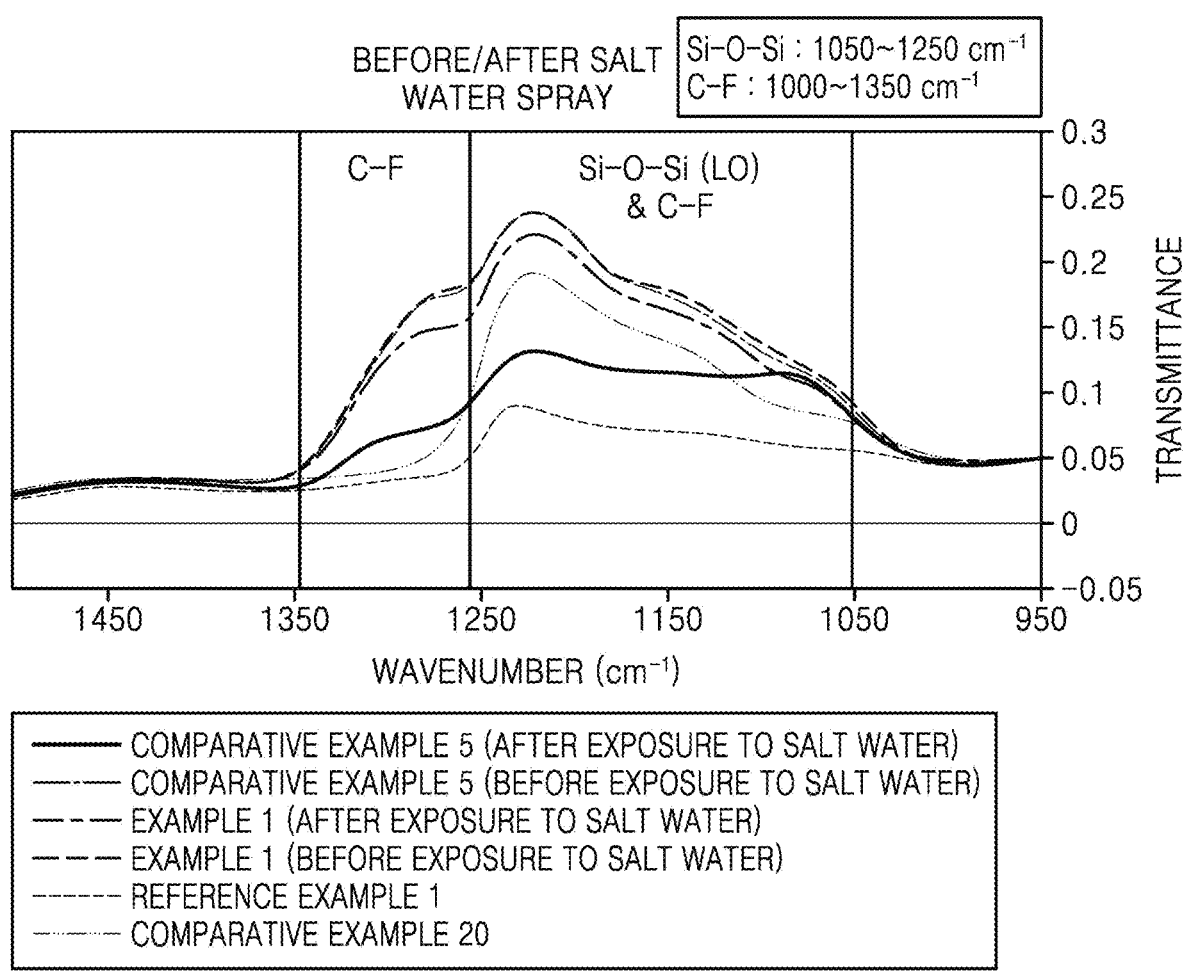
FIG. 6 shows infrared spectra before and after exposure to salt water of the laminates of Example 1 and Comparative Example 5, a Si substrate (Reference Example 1), and Comparative Example 20.

The IR spectra are shown in FIG. 6.

Referring to FIG. 6, the laminate of Example 1 including a tertiary amide group was found to have a remarkably reduced number of C—F bonds after the exposure to salt water, as compared to the laminate of Comparative Example 5 including no secondary amide group. Furthermore, considering that the laminate of Comparative Example 5 exhibits a peak of 1200 cm-1 after the exposure to salt water, which is greater than that of Reference Example 1 and less than that of Comparative Example 20, it is found that part of the intermediate layer was also damaged. Therefore, the laminate of Example 1 was identified to have improved durability by the inclusion of the silane compound including tertiary amide groups and the intermediate having a density of 2.2 g/cm².

Evaluation Example 4: Evaluation of Salinity Tolerance of Intermediate Layer

After the laminates prepared in Comparative Examples 19 to 21 were each placed in a salinity tolerance test chamber, a 5% NaCl solution was continuously sprayed at a 35° C. for 72 hours, and then appearance was evaluated through scanning electron microscopy (SEM) images.

Figures 7, 8:
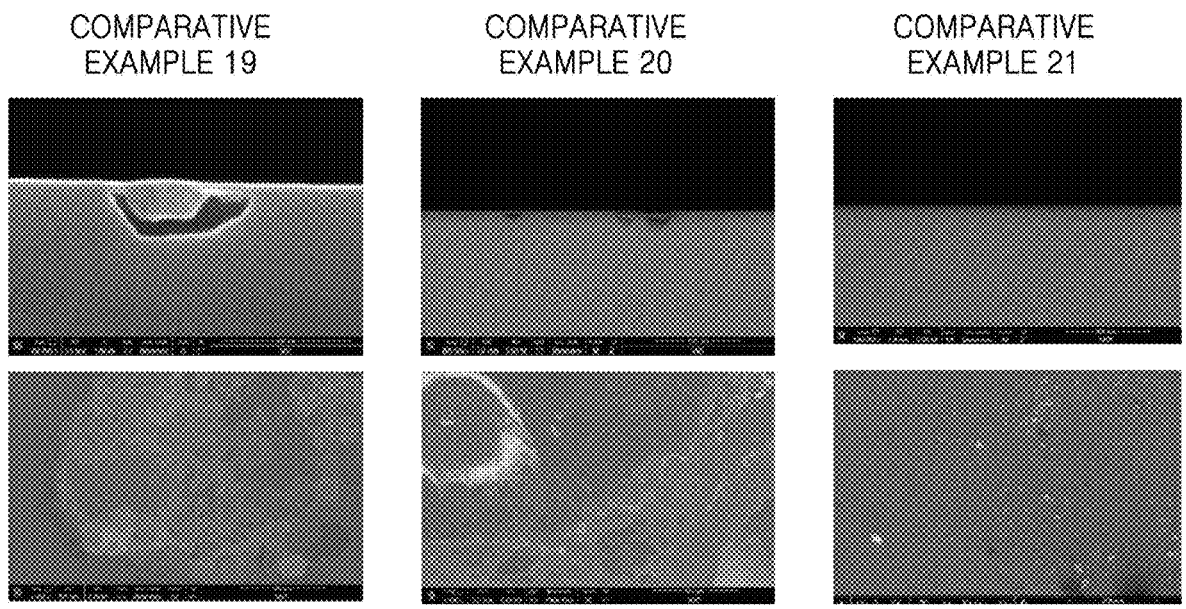
FIG. 7 shows scanning electron microscope (SEM) images after exposure to salt water of laminates of Comparative Examples 19 to 21.
FIG. 8 shows SEM images of surfaces after exposure to salt water of the laminates of Examples 1 and 3, and Comparative Example 15.

The SEM images are provided in FIG. 7.

Referring to FIG. 7, it was found that, although the degree of surface damage tended to be reduced as the density of the intermediate layer is increased to 2.0-2.25 g/cm², damage in appearance still occurred without the protective layer.

Evaluation Example 5: Evaluation of Salinity Tolerance with Respect to Density of Intermediate Layer After the laminates prepared in Comparative Examples 1 and 3 and Comparative Example 15 were each placed in a salinity tolerance test chamber, a 5% NaCl solution was continuously sprayed at a 35° C. for 72 hours, and then water droplets were dropped at 25° C. onto the protective layer using a drop shape analyzer (model DSA100, KRUSS, Germany) to measure a contact angle after salt water spray, and it was then evaluated whether or not the appearance had damage.

The measured contact angles are provided in Table 1 described above, and the appearance of each laminate was imaged and provided in FIG. 8.

Referring to FIG. 8, it was found that when the silane compounds used in the protective layers have the same molecular weight, salinity tolerance was achieved when the intermediate layer has a density of about 2.0 g/cm³ or greater, i.e., a density of 2.0 g/cm³ to 2.25 g/cm³.

Embodiments have been described above with reference to the drawings and examples, but these are only for a descriptive sense and not for purposes of limitation. It will be understood by a person skilled in the art that various modifications and other equivalent embodiments are possible therefrom. Therefore, the scope of the present invention should be defined by the following appended drawings.

According to an aspect, the laminate includes, between a substrate and a protective layer including a fluorine-containing (poly)ether amide silane compound having a specific molecular weight, an intermediate layer having a specific density, thereby inhibiting diffusion of salt and moisture and separation of the protective layer by hydrolysis, thus having both durability and salinity resistance.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present detailed description as defined by the following claims.

What is claimed is:

1. A laminate comprising:
a substrate,
a protective layer, and
an intermediate layer provided between the substrate and the protective layer,
wherein the protective layer comprises a fluorine-containing (poly)ether amide silane compound represented by Formula 1 and having a weight average molecular weight greater than about 2,000 Dalton, and
the intermediate layer comprises at least one Si—O bond and has a density greater than about 2.0 grams per cubic centimeter and less than about 2.5 grams per cubic centimeter

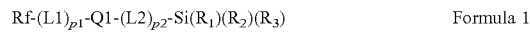

Rf-(L1)$_{p1}$-Q1-(L2)$_{p2}$-Si(R$_1$)(R$_2$)(R$_3$)   Formula 1 wherein, in Formula 1,
Rf is a fluorine-containing (poly)ether group,
Q1 is —N(R$_a$)—C(=O)O—, —C(=O)—N(R$_a$)—, —N(R$_a$)—S(=O)O—, —S(=O)—N(R$_a$)—, —OS(=O)—N(R$_a$)—C(=O)O—, or —OC(=O)—N(R$_a$)—S(=O)O—,
R$_a$ is -(L3)$_{p3}$-Si(R$_4$)(R$_5$)(R$_6$),
L1, L2, and L3 are each independently a substituted or unsubstituted C1-C20 alkylene group, a substituted or unsubstituted C1-C20 oxyalkylene group, or a combination thereof,
p1, p2, and p3 are each independently an integer of 1 to 10,
R$_1$, R$_2$, R$_3$, R$_4$, R$_5$, and R$_6$ are each independently hydrogen, a substituted or unsubstituted C1-C20 alkoxy group, a halogen atom, a hydroxy group, a substituted or unsubstituted C1-C20 alkyl group, a substituted or unsubstituted C1-C20 alkylthio group, a substituted or unsubstituted C6-C20 aryl group, a substituted or unsubstituted C6-C20 aryloxy group, a substituted or unsubstituted C6-C20 arylthio group, or a combination thereof, and
at least one of R$_1$, R$_2$, and R$_3$ is a substituted or unsubstituted C1-C20 alkoxy group, a substituted or unsubstituted C1-C20 alkylthio group, a halogen atom, or a hydroxy group, and
at least one of R$_4$, R$_5$, and R$_6$ is a substituted or unsubstituted C1-C20 alkoxy group, a substituted or unsubstituted C1-C20 alkylthio group, a halogen atom, or a hydroxy group.

2. The laminate of claim 1, wherein Rf is a perfluoro (poly)ether group.

3. The laminate of claim 1, wherein
the fluorine-containing (poly)ether group has:
a structure having a $CF_3(CF_2)_hO$ group at a terminal end with $-(CF_2CF_2O)_i-$, $-(CF_2O)_j-$ or $-(CH_2O)_k-$ bound to the $CF_3(CF_2)_hO$ group,
h and k are each independently an integer of 0 to 10, and
i and j are each independently an integer of 1 to 100.

4. The laminate of claim 1, wherein, in Formula 1, Rf is:
$CF_3O-(CF_2CF_2O)_i-(CF_2O)_j-(CH_2O)_k-$,
$CF_3O-(CF_2O)_j-(CF_2CF_2O)_i-(CH_2O)_k-$,
$CF_3CF_2O-(CF_2CF_2O)_i-(CF_2O)_j-(CH_2O)_k-$,
$CF_3CF_2O-(CF_2O)_j-(CF_2CF_2O)_i-(CH_2O)_k-$,
$CF_3CF_2CF_2O-(CF_2CF_2)_i-(CF_2O)_j-(CH_2O)_k-$, or
$CF_3CF_2CF_2O-(CF_2O)_j-(CF_2CF_2O)_i-(CH_2O)_k-$,
wherein, k is an integer of 0 to 10, and
i and j are each independently an integer of 1 to 100.

5. The laminate of claim 1, wherein the fluorine-containing (poly)ether amide silane compound represented by Formula 1 is a silane compound having a fluorine-containing (poly)ether group represented by Formula 2:

$CF_3(CF_2)_hO(CF_2CF_2O)_i(CF_2O)_j(CH_2O)_k-(CR_{13}R_{14})_{p1}-C(=O)-N(R_a)-(CH_2)_{p2}-Si(R_1)(R_2)(R_3)$   Formula 2 wherein, in Formula 2,
$R_a$ is $-(CH_2)_{p3}-Si(R_4)(R_5)(R_6)$,
$R_{13}$ and $R_{14}$ are each independently hydrogen, a C1-C5 alkyl, fluorine, or a fluorinated C1-C5 alkyl group,
p1, p2, and p3 are each independently an integer of 1 to 10,
h and k are each independently an integer of 0 to 10,
i and j are each independently an integer of 1 to 100,
$R_1$, $R_2$, $R_3$, $R_4$, $R_5$, and $R_6$ are each independently hydrogen, a substituted or unsubstituted C1-C20 alkoxy group, halogen atom, a hydroxy group, a substituted or unsubstituted C1-C20 alkyl group, a substituted or unsubstituted C6-C20 aryl group, or a combination thereof, and
wherein at least one of $R_1$, $R_2$, and $R_3$ is a substituted or unsubstituted C1-C20 alkoxy group, a halogen atom, or a hydroxy group, and at least one of $R_4$, $R_5$, and $R_6$ is a substituted or unsubstituted C1-C20 alkoxy group, a halogen atom, or a hydroxy group.

6. The laminate of claim 1, wherein the fluorine-containing (poly)ether amide silane compound represented by Formula 1, is
$CF_3O(CF_2CF_2O)_i(CF_2O)_j-(CH_2)-C(=O)N(-(CH_2)_2-Si(OCH_3)(OCH_3)(OCH_3))_2$,
$CF_3O(CF_2CF_2O)_i(CF_2O)_j-(CH_2OCH_2)-C(=O)N(-(CH_2)_2-Si(OCH_3)(OCH_3)(OCH_3))_2$,
$CF_3O(CF_2CF_2O)_i(CF_2O)_j-(CF_2)-C(=O)N(-(CH_2)_2-Si(OCH_3)(OCH_3)(OCH_3))_2$,
$CF_3O(CF_2CF_2O)_i(CF_2O)_j-(CH_2)-C(=O)N(-(CH_2)_2-Si(OCH_3)(OCH_3)(CH_3))_2$,
$CF_3O(CF_2CF_2O)_i(CF_2O)_j-(CH_2OCH_2)-C(=O)N(-(CH_2)_2-Si(OCH_3)(OCH_3)(CH_3))_2$,
$CF_3O(CF_2CF_2O)_i(CF_2O)_j-(CF_2)-C(=O)N(-(CH_2)_2-Si(OCH_3)(OCH_3)(CH_3))_2$,
$CF_3CF_2O(CF_2CF_2O)_i(CF_2O)_j-(CH_2)-C(=O)N(-(CH_2)_2-Si(OCH_3)(OCH_3)(OCH_3))_2$,
$CF_3CF_2O(CF_2CF_2O)_i(CF_2O)_j-(CH_2OCH_2)-C(=O)N(-(CH_2)_2-Si(OCH_3)(OCH_3)(OCH_3))_2$,
$CF_3CF_2O(CF_2CF_2O)_i(CF_2O)_j-(CF_2)-C(=O)N(-(CH_2)_2-Si(OCH_3)(OCH_3)(OCH_3))_2$,
$CF_3CF_2O(CF_2CF_2O)_i(CF_2O)_j-(CH_2)-C(=O)N(-(CH_2)_2-Si(OCH_3)(OCH_3)(CH_3))_2$,
$CF_3CF_2O(CF_2CF_2O)_i(CF_2O)_j-(CH_2OCH_2)-C(=O)N(-(CH_2)_2-Si(OCH_3)(OCH_3)(CH_3))_2$,
$CF_3CF_2CF_2O(CF_2CF_2O)_i(CF_2O)_j-(CH_2)-C(=O)N(-(CH_2)_2-Si(OCH_3)(OCH_3)(OCH_3))_2$,
$CF_3CF_2CF_2O(CF_2CF_2O)_i(CF_2O)_j-(CH_2OCH_2)-C(=O)N(-(CH_2)_2-Si(OCH_3)(OCH_3)(OCH_3))_2$,
$CF_3CF_2CF_2O(CF_2CF_2O)_i(CF_2O)_j-(CF_2)-C(=O)N(-(CH_2)_2-Si(OCH_3)(OCH_3)(OCH_3))_2$,
$CF_3CF_2CF_2O(CF_2CF_2O)_i(CF_2O)_j-(CH_2)-C(=O)N(-(CH_2)_2-Si(OCH_3)(OCH_3)(CH_3))_2$,
$CF_3CF_2CF_2O(CF_2CF_2O)_i(CF_2O)_j-(CH_2OCH_2)-C(=O)N(-(CH_2)_2-Si(OCH_3)(OCH_3)(CH_3))_2$,
$CF_3CF_2CF_2O(CF_2CF_2O)_i(CF_2O)_j-(CF_2)-C(=O)N(-(CH_2)_2-Si(OCH_3)(OCH_3)(CH_3))_2$,
$CF_3O(CF_2CF_2O)_i(CF_2O)_j-(CH_2)-C(=O)N(-(CH_2)_3-Si(OCH_3)(OCH_3)(OCH_3))_2$,
$CF_3O(CF_2CF_2O)_i(CF_2O)_j-(CH_2OCH_2)-C(=O)N(-(CH_2)_3-Si(OCH_3)(OCH_3)(OCH_3))_2$,
$CF_3O(CF_2CF_2O)_i(CF_2O)_j-(CF_2)-C(=O)N(-(CH_2)_3-Si(OCH_3)(OCH_3)(OCH_3))_2$,
$CF_3O(CF_2CF_2O)_i(CF_2O)_j-(CH_2)-C(=O)N(-(CH_2)_3-Si(OCH_3)(OCH_3)(CH_3))_2$,
$CF_3O(CF_2CF_2O)_i(CF_2O)_j-(CH_2OCH_2)-C(=O)N(-(CH_2)_2-Si(OCH_3)(OCH_3)(CH_3))_2$,
$CF_3O(CF_2CF_2O)_i(CF_2O)_j-(CF_2)-C(=O)N(-(CH_2)_3-Si(OCH_3)(OCH_3)(CH_3))_2$,
$CF_3CF_2O(CF_2CF_2O)_i(CF_2O)_j-(CH_2)-C(=O)N(-(CH_2)_3-Si(OCH_3)(OCH_3)(OCH_3))_2$,
$CF_3CF_2O(CF_2CF_2O)_i(CF_2O)_j-(CH_2OCH_2)-C(=O)N(-(CH_2)_3-Si(OCH_3)(OCH_3)(OCH_3))_2$,
$CF_3CF_2O(CF_2CF_2O)_i(CF_2O)_j-(CF_2)-C(=O)N(-(CH_2)_3-Si(OCH_3)(OCH_3)(OCH_3))_2$,
$CF_3CF_2O(CF_2CF_2O)_i(CF_2O)_j-(CH_2)-C(=O)N(-(CH_2)_3-Si(OCH_3)(OCH_3)(CH_3))_2$,
$CF_3CF_2O(CF_2CF_2O)_i(CF_2O)_j-(CH_2OCH_2)-C(=O)N(-(CH_2)_3-Si(OCH_3)(OCH_3)(CH_3))_2$,
$CF_3CF_2O(CF_2CF_2O)_i(CF_2O)_j-(CF_2)-C(=O)N(-(CH_2)_3-Si(OCH_3)(OCH_3)(CH_3))_2$,
$CF_3CF_2CF_2O(CF_2CF_2O)_i(CF_2O)_j-(CH_2)-C(=O)N(-(CH_2)_3-Si(OCH_3)(OCH_3)(OCH_3))_2$,
$CF_3CF_2CF_2O(CF_2CF_2O)_i(CF_2O)_j-(CH_2OCH_2)-C(=O)N(-(CH_2)_3-Si(OCH_3)(OCH_3)(OCH_3))_2$,
$CF_3CF_2CF_2O(CF_2CF_2O)_i(CF_2O)_j-(CF_2)-C(=O)N(-(CH_2)_2-Si(OCH_3)(OCH_3)(OCH_3))_2$,
$CF_3CF_2CF_2O(CF_2CF_2O)_i(CF_2O)_j-(CH_2)-C(=O)N(-(CH_2)_3-Si(OCH_3)(OCH_3)(CH_3))_2$,
$CF_3CF_2CF_2O(CF_2CF_2O)_i(CF_2O)_j-(CH_2OCH_2)-C(=O)N(-(CH_2)_3-Si(OCH_3)(OCH_3)(CH_3))_2$, or
$CF_3CF_2CF_2O(CF_2CF_2O)_i(CF_2O)_j-(CF_2)-C(=O)N(-(CH_2)_3-Si(OCH_3)(OCH_3)(CH_3))_2$, and
wherein i and j are each independently an integer of 1 to 100.

7. The laminate of claim 1, wherein the fluorine-containing (poly)ether amide silane compound has a molecular weight of about 4,000 Dalton or more and about 7,000 Dalton or less.

8. The laminate of claim 1, wherein a ratio of the pore area to the surface area of the protective layer is about 0.45 or less.

9. The laminate of claim 1, wherein the protective layer has a thickness of about 1 micrometer or less.

10. The laminate of claim 1, wherein the intermediate layer has a density of about 2.1 grams per cubic centimeter to about 2.3 grams per cubic centimeter.

11. The laminate of claim 1, wherein the intermediate layer comprises at least one silanol functional group.

12. The laminate of claim 1, wherein the silanol functional group comprises isolated silanol, geminal silanol, vicinal silanol, or a combination thereof.

13. The laminate of claim 1, wherein the intermediate layer is crosslinked to the protective layer by at least one siloxane bond.

14. The laminate of claim 13, wherein the siloxane bond is formed by reaction of a silanol group of the intermediate layer and a silane group of the fluorine-containing (poly) ether amide silane compound of the protective layer.

15. The laminate of claim 1, wherein a fluorine-containing (poly)ether group of the fluorine-containing (poly)ether group-containing silane compound bound to the intermediate layer is oriented toward a side opposite to the substrate.

16. The laminate of claim 1, wherein the intermediate layer has a thickness of about 100 nanometers or less.

17. The laminate of claim 1, wherein the substrate comprises ceramic, glass, or polymer.

18. The laminate of claim 1, wherein the substrate and the intermediate layer have a monolithic structure by a chemical bond.

19. A display device comprising the laminate of claim 1.

20. An article comprising the display device of claim 19.

* * * * *